US006809531B2

(12) United States Patent
Slye et al.

(10) Patent No.: US 6,809,531 B2
(45) Date of Patent: Oct. 26, 2004

(54) DIGITAL POTENTIOMETER DEVICE

(76) Inventors: Bradley D. Slye, 5590 Trenton La. N., Plymouth, MN (US) 55442; George W. Edwards, Jr., 8484 Minute Man Alcove, Eden Prairie, MN (US) 55344; Daniel E. Bisila, 11740 Taylor St. NE., Blaine, MN (US) 55434

( * ) Notice: Subject to any disclaimer, the term of this patent is extended or adjusted under 35 U.S.C. 154(b) by 94 days.

(21) Appl. No.: 10/373,424

(22) Filed: Feb. 24, 2003

(65) Prior Publication Data

US 2004/0164751 A1 Aug. 26, 2004

(51) Int. Cl.[7] ........................... G01R 27/08; G05B 1/06

(52) U.S. Cl. ....................................... 324/714; 318/663

(58) Field of Search ................................ 324/714, 713, 324/691, 649, 600, 723, 73.1; 318/663, 295, 567, 600, 628; 338/89; 330/108; 374/168; 388/824, 838; 702/107

(56) References Cited

U.S. PATENT DOCUMENTS 3,662,246 A * 5/1972 Cohen et al. ............... 318/663
3,953,820 A * 4/1976 Nishioka et al. .............. 338/89
4,247,816 A * 1/1981 Harrer et al. ............... 324/714
6,737,877 B1 * 5/2004 Hatton et al. ............... 324/723

* cited by examiner

*Primary Examiner*—Anjan Deb
*Assistant Examiner*—Hoai-An D. Nguyen

(57) ABSTRACT

A digital potentiometer device has a potentiometer, coupled to a reference voltage, that generates a voltage that can be varied. A programmable scaling function scales the reference voltage and the potentiometer's wiper voltage depending on stored user variables. An analog-to-digital converter converts the scaled potentiometer voltage to a digital value readable by a controller circuit. The controller circuit controls the scaling function and display of the potentiometer position with the user variables.

19 Claims, 5 Drawing Sheets

DIGITAL POTENTIOMETER DEVICE

BACKGROUND

I. Field of the Invention

The present invention relates generally to potentiometers.

II. Description of the Related Art

Potentiometers are resistors in which the resistance is variable by adjusting a control device. For example, one type of potentiometer has a knob that is turned in one direction (e.g., clockwise) to increase the resistance and in the opposite direction to decrease the resistance. The resistance is typically measured between the wiper of the potentiometer and one of the end terminals.

One problem with potentiometers is that the resistance selected by adjusting the control is not readily apparent. A multi-meter is typically connected across the wiper connection and one end of the potentiometer in order to measure the change in resistance. If a voltage is coupled across the potentiometer, the multi-meter can be used to measure the change in voltage. In either case, a separate, bulky, measuring device is required in order to adjust the potentiometer accurately for a particular application. There is a need in the art for a potentiometer that can be accurately adjusted without a need for additional measuring equipment.

SUMMARY

The present invention encompasses a digital potentiometer device. The device has a potentiometer, coupled to a reference voltage, that generates a voltage that is variable by adjusting a potentiometer control input.

A programmable, voltage-scaling function generates a scaled variable voltage and a scaled reference voltage from the potentiometer's voltage and the reference voltage, respectively. An analog-to-digital converter generates a digital signal from the analog scaled variable voltage. In one embodiment, the analog-to-digital converter uses the scaled reference voltage as a voltage reference.

Two input switches are used to enter user variables. The user variables set the units to be used by the device controller circuit when displaying the analog-to-digital converter data that indicates the potentiometer position. The user variables also determine the amount of scaling performed on the variable and reference voltages by the scaling function.

DETAILED DESCRIPTION

The embodiments of the present invention provide a digital potentiometer device that displays the potentiometer's position in units programmed by the user. The device eliminates the need for additional equipment.

Figure 1:
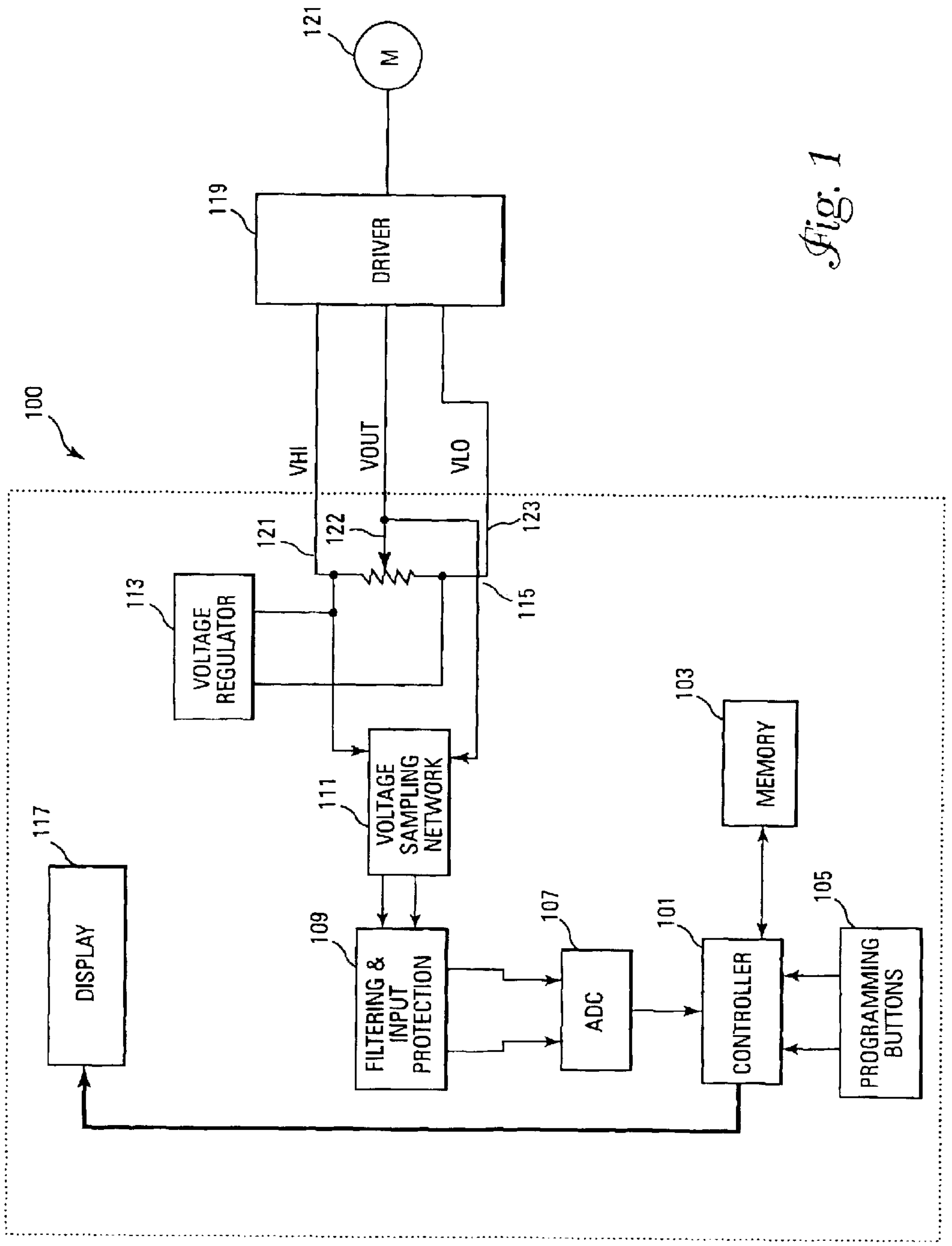
FIG. 1 shows a block diagram of one embodiment of a digital potentiometer system of the present invention.

FIG. 1 illustrates a block diagram of a digital potentiometer system of the present invention. The system is comprised of a digital potentiometer device (100) that is connected to a driver circuit (119). The driver circuit (119) may be connected to a motor (121). In this embodiment, the driver circuit (119) uses the variable resistance of the potentiometer (100) in order to set the range of speeds of the motor (121).

The embodiment of FIG. 1 is for purposes of illustration only. The digital potentiometer device (100) can be used in any system in which a variable resistance/voltage is required. For example, the driver (119) could be a hydraulic controller, a temperature controller, or a vibration controller. The device's display can then be set to display whatever units are necessary for the particular situation. These units can include resistance, voltage, time-in-process, or revolutions per minute.

The digital potentiometer device (100) is comprised of a controller (101) that controls operation of the digital features of the device (100). The controller (101) may be a microprocessor, a microcontroller, or any controller circuitry.

The controller (101) is coupled to a memory (103) that stores entered settings and default values for the device (100). In one embodiment, the memory (103) is electrically erasable programmable read only memory (EEPROM). Alternate embodiments use other types of memory (103) such as flash memory or battery backed-up random access memory (RAM).

Programming buttons (105) are coupled to the controller (101) in order to enable entry of various parameters. These buttons (105), in one embodiment are single-pole, double-throw push button type switches. Alternate embodiments use other types of switches. The operation of these buttons (105) for programming the device (100) is subsequently described in greater detail.

A potentiometer (115) provides the variable resistance for the device (100). The $V_{HI}$ terminal (121) of the potentiometer (115), in one embodiment, is connected to the driver circuit's (119) output voltage connection. The $V_{LO}$ terminal (123) of the potentiometer (115), in one embodiment, is connected to the driver circuit's ground or other voltage that is less than the output voltage connection. The potentiometer (115) wiper terminal (122), in one embodiment, is the device's (100) variable voltage/resistance output and is connected to the driver's input.

As shown later, with reference to FIG. 2, the output voltage from the driver (119) or other system circuit is used to power the device (100). A voltage regulator (113) generates the voltage(s) required by the device (100) for proper operation. In one embodiment, this voltage is 3.0 VDC. Alternate embodiments use other voltages.

A voltage-sampling network (111) is connected across the potentiometer's (115) high side terminal (121) and wiper terminal (122). This network (111) generates the scaled high-end reference voltage from the driver circuit's (119) output voltage and the scaled wiper voltage.

The outputs from the voltage-sampling network (111) are input to a filtering and input protection circuit (109). This circuit (109) removes voltage spikes and provides overvoltage protection to the rest of the circuitry of the device (100).

An analog to digital converter (ADC) (107) samples the outputs of the filtering and input protection circuit (109).

The ADC (107) provides to the controller (101) a digital representation of the relationship between the potentiometer $V_{HI}$ voltage (121) and the voltage from the potentiometer's wiper terminal (122).

A display (117) is connected to the controller (101) in order to display the settings of the device (100). In one embodiment, the display (117) is a liquid crystal display (LCD). Alternate embodiments use other types of displays including light emitting diode.

Figure 2:
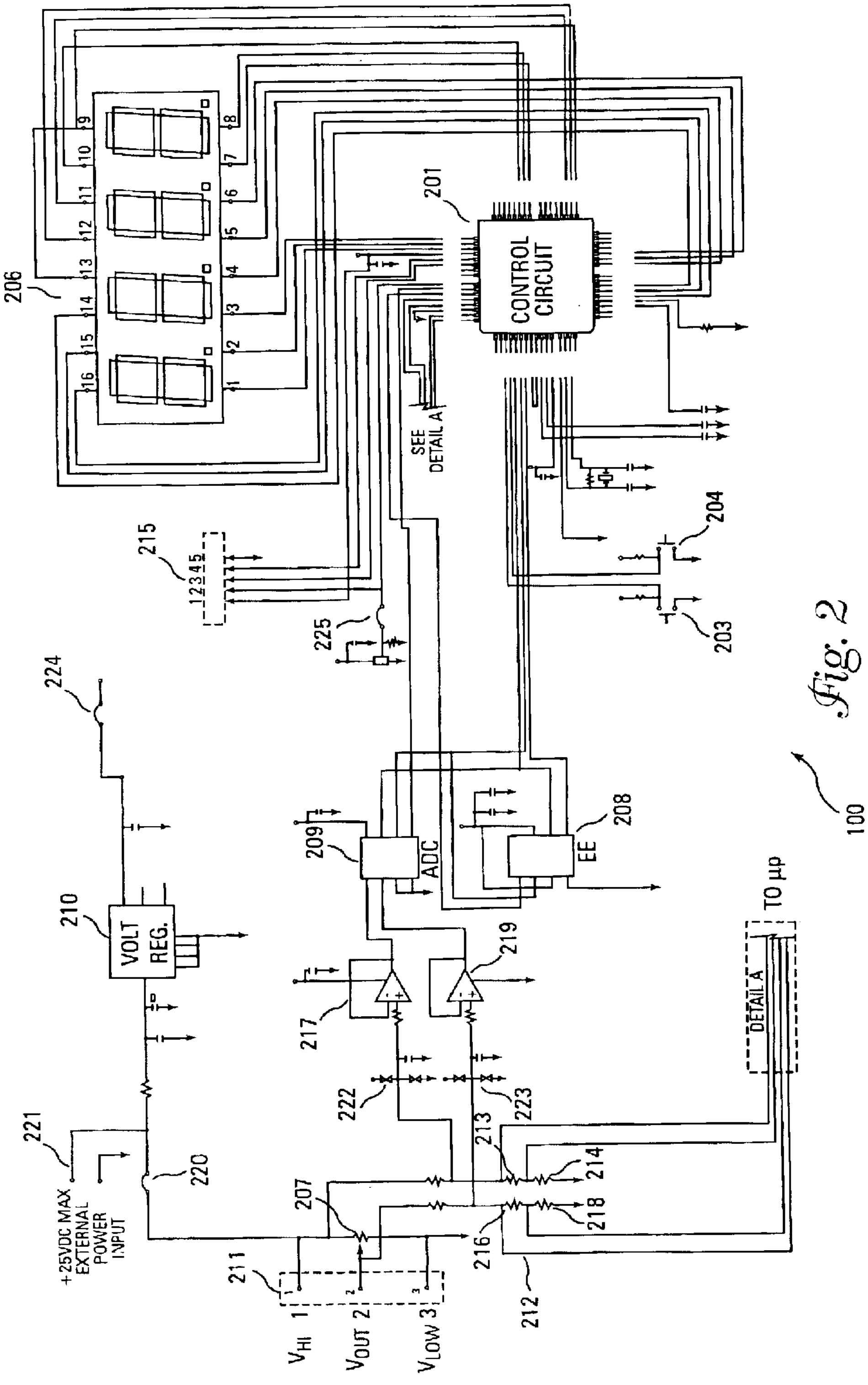
FIG. 2 shows a schematic diagram of one embodiment of a digital potentiometer device of the present invention.

FIG. 2 illustrates a schematic diagram of one embodiment of the digital potentiometer device (100) of the present invention. The embodiment of FIG. 2 is for purposes of illustration only and does not limit the present invention to any one set of components and/or component configuration.

The device (100) includes a microprocessor (201) to control programming and other operations. For example, the microprocessor is responsible for reading the value of the 10 k Ohm potentiometer wiper (207) and displaying the value in the units selected by the user.

In one embodiment, the microprocessor (201) is a reduced instruction set computer (RISC). Alternate embodiments use other types of microprocessors.

The microprocessor (201) is connected to a display (206). The display (206) of FIG. 2 is a multiple digit LCD. The display (206) indicates the settings and the values of the user variables that are stored in the memory (208) of the device (100) and to display the value of the potentiometer setting. In one embodiment the LCD (206) includes at least one colon so that time can be displayed for time-in-process embodiments. This colon may be there permanently for a fixed embodiment or removed by the microprocessor (201) when a value not requiring the colon is desired to be displayed.

The memory (208) connected to the microprocessor (201) is EEPROM type memory to which the microprocessor (201) writes data to be stored. EEPROM is non-volatile memory that allows data to be permanently stored even if power has been removed from the device (100). This data can include upper and lower device operating limits as well as device default data such as decimal point placement in the display and other display control.

Two pushbutton, single-pole, double-throw switches (203 and 204) are connected to the microprocessor (201) in order to enter data. In the embodiment of FIG. 2, one switch (203) is used to increment data on the LCD (206). During programming, each time the switch (203) is depressed data on the display is incremented. The second switch (204) enters that data. Depressing both switches simultaneously may initiate another function such as resetting the system to a predefined, default state.

Once the desired upper and lower limits of the calibration variables are entered, the microprocessor (201) can interpolate a linear change in voltage between the two points. For example, the microprocessor (201) can use y=mx+b to define the line. In this case, "y" is scaled to the user variables entered by the switches and "x" is the resistance values that define the line and correspond to each user variable. Other embodiments may use other mathematical transfer equations.

The user variables are used by the microprocessor (201) to translate a selected resistance value on the potentiometer (207) to the desired display value. The user variables include the units desired for display, mode of operation, and for scaling the device to a driver's (119) $V_{HI}$ and $V_{LO}$ voltages. This operation of the system of FIG. 2 is discussed in greater detail with reference to the method of FIG. 3.

A connection at (211) connects the device (100) to an external circuit. The connection (211) couples the device to power ($V_{HI}$) and ground ($V_{LO}$). The wiper of the potentiometer (207) is connected to $V_{out}$. $V_{HI}$ and $V_{LO}$ are used by the system of the present invention to provide power to the various electronic components.

r The potentiometer (207), in one embodiment, is a 10 k Ohm potentiometer. Alternate embodiments use other potentiometer values.

In one embodiment, $V_{HI}$ can be in the range of 3.9 to 15 volts. This gives the system of the present invention a wide range of operating voltages.

In the embodiment of FIG. 2, $V_{LO}$ is connected to ground. Alternate embodiments, however, connect $V_{LO}$ to another reference voltage.

As is well known in the art, the wiper voltage changes as the wiper is moved by the movement of the potentiometer control. This is due to the change of resistance as the control is adjusted.

The $V_{HI}$ voltage is input to two diodes (222) that act as filtering and overvoltage protection. $V_{HI}$ is also connected to an operational amplifier (217). The output of the operational amplifier is the voltage that is provided as a reference voltage to an analog to digital converter (ADC) (209).

Similarly, the $V_{out}$ voltage is input to two diodes (223) that act as filtering and overvoltage protection. $V_{out}$ is also connected to an operational amplifier (219). The output of this operational amplifier is the voltage that is provided as an input voltage to the ADC (209) as the analog value to convert to a representative digital value.

The ADC (209) is connected to the microprocessor (201). The microprocessor can then read the digitized voltage values as input from the potentiometer (207).

Using the high-end potentiometer supply voltage as the ADC reference voltage, the wiper voltage can be measured to the full supply voltage (i.e., maximum potentiometer resistance). This effectively determines the potentiometer position. Since the device's (100) electronics operate at 3.0 V, in one embodiment, the reference voltage needs to be scaled down from the potentiometer supply voltage to the 2.0 V maximum input for the operational amplifier (217). This voltage is different for different embodiments. A scaling circuit (212), comprised of resistors, performs the scaling function to generate this lower reference voltage. The scaling circuit (212) also provides the programmable range function of the digital potentiometer device (100).

The scaling circuit (212) permits a high reference voltage to be used for the range of input voltages (e.g., 3.9 to 15V). For example, if the supply voltage were 15V, then the scaling must be a factor of 0.133 to reduce the voltage to the 2.0V maximum input to the operational amplifiers (217, 219). The 2.0V is passed on as the ADC reference voltage. If the supply voltage were only 5.0V, the reference voltage without the scaling circuit (212) would only be 0.66V. Since low reference voltages permit more influence from noise, the scaling circuit (212) of the present invention performs a scaling function to improve repeatability of voltage readings, take full advantage of the resolution of the ADC, and reduces the influence of noise.

The scaling provided by the scaling circuit (212) is programmable by the microprocessor (201). This enables the device (100) to provide a user-programmable voltage range for the potentiometer (207), depending on the application.

The microprocessor (201) reads user variables stored in memory (208) and provides either a high impedance or a ground to the nodes (213–216) of the scaling circuit (212).

A ground at a node effectively removes the resistors below that point from the circuit and, thus, decreases the voltage to a particular operational amplifier (217 or 219). Conversely, a high impedance at a node (213–216) increases the voltage to the operational amplifier (217 or 219).

The scaling circuit (212) of the present invention represents only one way to provide programmable, scaled voltages to the ADC (209). Alternate embodiments use other voltage scaling circuits to perform the same function.

A voltage regulator (210) is connected to the $V_{HI}$ input voltage. The regulator (210) provides the 3.0 V supply voltage used by the electronic components of this embodiment. Alternate embodiments provide other voltages.

Jumpers (224, and 225) are used during the manufacturing process and allow serial programming of the device. With these jumpers (224, and 225) removed the device (100) can be serially programmed through a programming connector (215). Jumper 220 allows for alternate methods of powering the device during the manufacturing process.

The serial programming provides the manufacturer with the ability to install the entire computer coded algorithm into the microprocessor's permanent memory prior to installation of the jumper (224, and 225).

Figure 3:
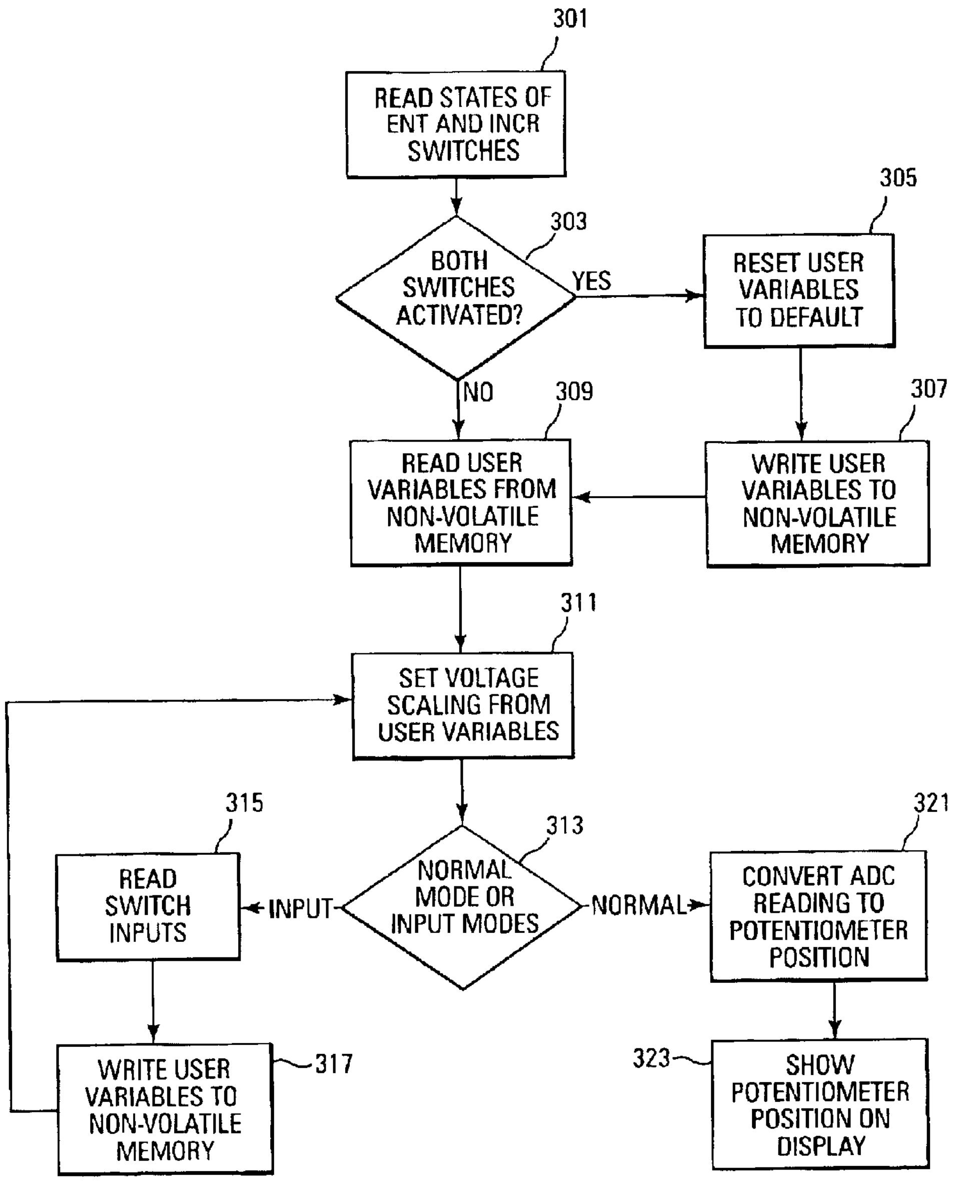
FIG. 3 shows a flowchart of one embodiment of a method for using a digital potentiometer device of the present invention.

FIG. 3 illustrates a flowchart of one embodiment of a method of operation of the digital potentiometer device of the present invention. The method reads the state of the switches (i.e., "increment" and "enter") (301). If both switches are depressed (303) during power up, the user is resetting the user variables to the factory default values. These values are stored in non-volatile memory for later recall.

The microprocessor reads the default user variables out of memory (305) and stores them in a predetermined user variable memory location. In one embodiment, these variables are stored in EEPROM (307).

The method then reads the user variables that are stored in the predetermined user variable memory location (309). This data is used to set the amount of scaling performed (311) by the scaling circuit of FIG. 2. As described above, the user variables select the voltage range of the potentiometer.

In one embodiment, the digital potentiometer device of the present invention has an input mode and a normal mode. These modes are user selectable by one or both of the switch inputs. The input mode permits the user to input data such as the voltage range of the potentiometer. The normal mode reads the potentiometer's wiper voltage and converts the analog-to-digital converter reading to a potentiometer position for display.

Referring again to FIG. 3, the method determines if the normal or input mode has been selected (313). If the input mode was selected, the switches are read (315) to determine the user variables being input by a user. In one embodiment, the variables are input by the user depressing the "enter" switch to cause one of the digits in the display to flash. The "increment" switch can then be depressed to increment the digit to the desired value. The "enter" switch is depressed again to go to the next digit or, if no digits remain, to complete the enter function. The entered data is then stored in non-volatile memory (317). In another embodiment, the data is stored in some other form of memory.

If the normal mode was selected (313), the microprocessor converts the analog-to-digital converter reading to a potentiometer position (321). This position is then displayed (323) in units selected by the user (e.g., volts, time in process, resistance, speed, etc.).

Figure 4:
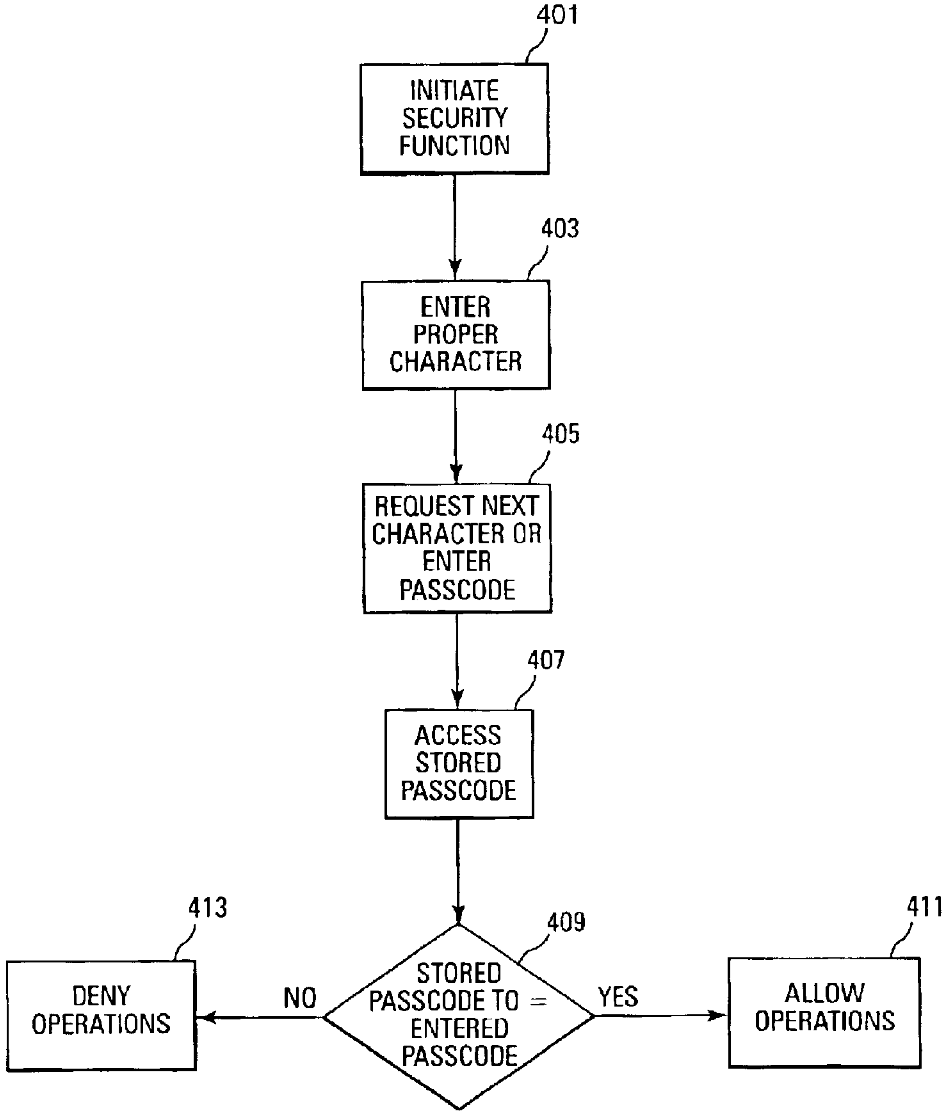
FIG. 4 shows a flowchart of one embodiment of a security method of the present invention.

In one embodiment, the present invention also includes a security function to prevent unauthorized use of the potentiometer device. FIG. 4 illustrates a flowchart of one embodiment of a security method of the present invention.

Prior to allowing any limits to be entered or altered, the microprocessor ignores any inputs from the switches until a passcode is entered. For example, the enter switch may be depressed to initiate the security function (401) and to bring up the first character of the passcode. The increment switch can be depressed multiple times to display the proper character for that location (403) in the passcode. Once the proper character is displayed, the enter switch is depressed again (405) to either bring up the next character or to enter the passcode for authorization by the microprocessor.

The microprocessor then accesses the memory (407) for the proper passcode and compares that (409) with the entered passcode. If the two passcodes are identical, all further operations are authorized (411). Or, in the event that a different passcode is required for different operations, all operations allowed by a particular passcode are allowed. If the entered passcode is not correct, attempts to alter the programming are ignored (413) and an error message may be displayed.

Figure 5:
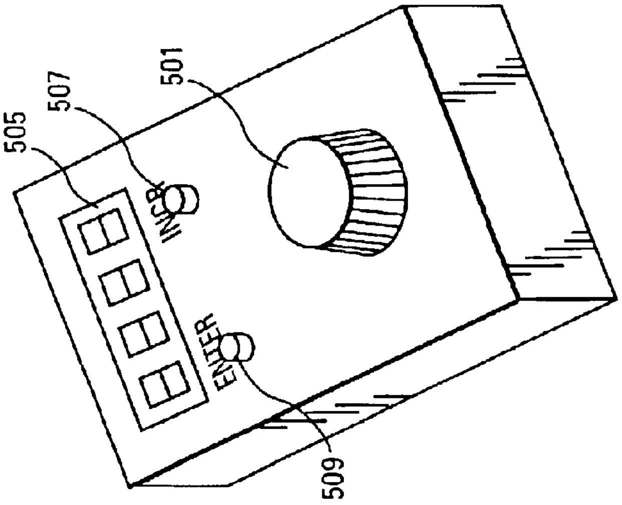
FIG. 5 shows a perspective view of one embodiment of the digital potentiometer device of the present invention.

A perspective view of the digital potentiometer device of the present invention is illustrated in FIG. 5. This view shows the knob (501) that is used to adjust the resistance of the potentiometer. The display (505) is above the knob (501). The pushbutton switches (507 and 509) are placed to either side of the knob (501).

Figure 6:
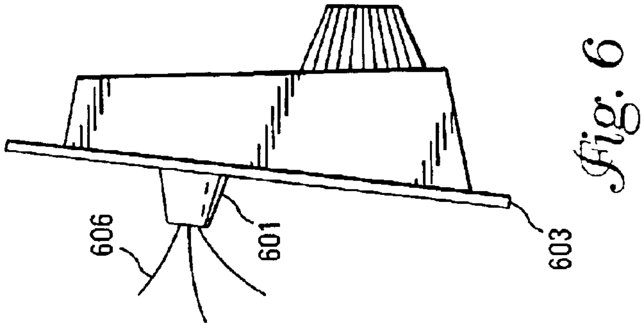
FIG. 6 shows a side view of one embodiment of the digital potentiometer device of the present invention.

FIG. 6 illustrates a side view of the device as it would look mounted on a control panel, door, etc. (603). In one embodiment, the device has a projection (601) that mounts into a standard 0.375 inch hole of the control panel, door, etc. (603) as a typical prior art potentiometer. The device is connected to a circuit with the same three-wire connection (606) as the typical prior art potentiometer. These features permit the digital potentiometer device of the present invention to be a direct replacement for most prior art potentiometers.

Numerous modifications and variations of the present invention are possible in light of the above teachings. It is therefore to be understood that within the scope of the appended claims, the invention may be practiced otherwise than as specifically described herein.

What is claimed is:

1. A digital potentiometer device comprising:

a potentiometer for generating a variable voltage in response to a reference voltage;

a programmable, voltage scaling function coupled to the variable voltage and the reference voltage for generating a scaled variable voltage and a scaled reference voltage;

an analog-to-digital converter for generating a digital signal representative of the relationship between the scaled reference voltage and the scaled variable voltage;

an input switch for entering user variables; and a controller circuit that reads the digital signal and controls the programmable, voltage scaling function in response to the user variables.

2. The device of claim 1 and further including non-volatile memory for storing the user variables.

3. The device of claim 2 wherein the device is only capable of calibration or programming input after input of a security code.

4. The device of claim 1 and further including a display coupled, to the controller circuit, for displaying the digital signal in manner responsive to the user variables.

5. The device of claim 4 wherein the display is a multiple digit liquid crystal display.

6. The device of claim 1 wherein the programmable voltage scaling function is a resistor network coupled to the controller circuit such that the controller circuit selectively grounds predetermined nodes between resistors in the resistor network in response to the user variables.

7. A digital potentiometer device comprising:

a potentiometer for generating a variable voltage in response to a reference voltage;

a programmable voltage scaling circuit that generates a scaled reference voltage and a scaled variable voltage;

an analog-to-digital converter that generates a digital signal in response to the scaled variable voltage and the scaled reference voltage;

a first input switch for entering user variables;

memory for storing the user variables;

a controller circuit coupled to the analog-to-digital converter, the first input switch, and the programmable scaling circuit, the controller circuit capable of accepting and writing the user variables to memory, and programming the programmable voltage scaling circuit in response to the user variables; and a display having at least one digit coupled to the controller circuit for displaying the digital signal in units selected by the user variables.

8. The device of claim 7 and further including overvoltage protection to couple the scaled reference voltage and scaled variable voltage to the analog-to-digital converter.

9. The device of claim 7 and further including a second input switch coupled to the controller circuit for inputting the user variables in conjunction with the first input switch.

10. The device of claim 7 and further including a voltage regulator that generates a regulated voltage for powering the analog-to-digital converter, the controller circuit, the memory, and input/filtering operational amplifiers.

11. A method for operation of a digital potentiometer device having a reference voltage, the method comprising:

entering user variables;

generating a variable voltage in response to the reference voltage;

generating a scaled variable voltage and a scaled reference voltage in response to the user variables;

converting the scaled variable voltage to a digital signal; and displaying the digital signal in units responsive to the user variables.

12. The method of claim 11 and further including storing the user variables in memory.

13. The method of claim 11 wherein the variable voltage is variable by adjusting a potentiometer control.

14. A method for operation of a digital potentiometer device having a reference voltage, the method comprising:

reading user variables from memory;

generating a variable voltage in response to the reference voltage;

generating a scaled variable voltage and a scaled reference voltage in response to the user variables;

converting the scaled variable voltage to a digital signal; and displaying the digital signal in units responsive to the user variables.

15. The method of claim 14 wherein generating the scaled variable and the scaled reference voltages is performed by a programmable voltage scaling function in response to the user variables.

16. A method for operation of a digital potentiometer device having a reference voltage, a plurality of input switches, and memory, the method comprising:

reading a state of each of the plurality of input switches;

if the state of the plurality of input switches indicates a reset condition, reading default user variables from memory and storing in a predetermined memory location;

reading the user variables from the predetermined memory location;

adjusting a voltage scaling function in response to the user variables;

if the device is in a normal display mode, converting a position of the potentiometer to a digital signal; and displaying the position of the potentiometer in units indicated by the user variables.

17. The method of claim 16 and further including:

if the device is in an input mode, reading inputs from the plurality of input switches to determine new user variables; and storing the new user variables in the predetermined memory location.

18. The method of claim 16 wherein the predetermined memory location is in non-volatile memory.

19. A method for replacing a conventional potentiometer comprising:

removing the conventional potentiometer from a circuit; and installing a digital potentiometer device in place of the conventional potentiometer wherein the digital potentiometer device comprises:

a device potentiometer that generates a variable voltage in response to a reference voltage;

a programmable, voltage scaling function coupled to the variable voltage and the reference voltage for generating a scaled variable voltage and a scaled reference voltage;

an analog-to-digital converter for generating a digital signal representative of a relationship between the scaled reference voltage and the scaled variable voltage;

input switches for entering user variables; and a controller circuit that reads the digital signal and controls the programmable, voltage scaling function in response to the user variables, and displays a potentiometer position in user units.

* * * * *